United States Patent [19]

Kub

[11] 4,319,261
[45] Mar. 9, 1982

[54] SELF-ALIGNED, FIELD AIDING DOUBLE POLYSILICON CCD ELECTRODE STRUCTURE

[75] Inventor: Francis J. Kub, Pasadena, Md.

[73] Assignee: Westinghouse Electric Corp., Pittsburgh, Pa.

[21] Appl. No.: 147,802

[22] Filed: May 8, 1980

[51] Int. Cl.³ .................... H01L 29/78; H01L 29/04; G11C 19/28
[52] U.S. Cl. ........................ 357/24; 357/59; 357/91; 307/221 D
[58] Field of Search ............. 357/24, 59, 91; 307/221 D

[56] References Cited
U.S. PATENT DOCUMENTS

| | | | |
|---|---|---|---|
| 3,728,590 | 4/1973 | Kim et al. | 357/24 |
| 3,967,365 | 7/1976 | Friedrich | 357/24 |
| 4,156,247 | 5/1979 | Hartman et al. | 357/24 |

Primary Examiner—Gene M. Munson
Attorney, Agent, or Firm—W. E. Zitelli

[57] ABSTRACT

A charge coupled device (CCD) having a double layer polysilicon electrode structure and method for making the same are disclosed. The CCD structure provides for alignment of the polysilicon electrodes from one layer to another to eliminate substantially the overlap capacitance normally associated with conventional double layer CCD structures. More particularly, a first polysilicon layer is disposed over the gate dielectric of the CCD and comprises alternating doped and undoped regions laterally along the channel in the direction of change transfer, the regions extending the length of the channel transverse to the charge transfer and extending from the gate dielectric to the top surface thereof to form corresponding doped and undoped surface areas. On top of each undoped surface area and substantially aligned therewith is first a layer of dielectric material and second a layer of doped polysilicon. The first and second layers of doped polysilicon constitute the aligned double layer electrode structure of the CCD with electrical insulation afforded by the interviewing dielectric layer. The disclosed method of fabrication offers fewer processing steps and a reliable and reproducible product.

11 Claims, 23 Drawing Figures

FIG. 7A $\phi_1$-ATTRACTIVE
$\phi_2$-REPULSIVE

FIG. 7B $\phi_1$-REPULSIVE
$\phi_2$-ATTRACTIVE

SELF-ALIGNED, FIELD AIDING DOUBLE POLYSILICON CCD ELECTRODE STRUCTURE

BACKGROUND OF THE INVENTION

This invention relates broadly to the field of charge coupled devices, and more particularly, to a structure having double electrode conductive layers of doped polycrystalline material, the electrode layers being aligned to eliminate substantially overlapping of one conductive layer to another.

Figure 1:
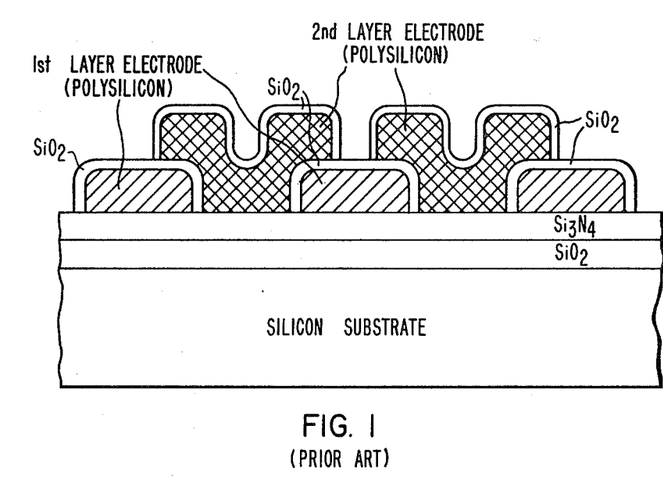
FIG. 1 is a cross-sectional view of a representative portion of a conventional double layer electrode charge coupled device structure.

One of the most difficult process steps in fabricating charge coupled devices is to ensure that the gate electrodes on different conductive levels overlap one another as shown in FIG. 1. The reason for this is that, in general, conventional fabricating techniques cannot guarantee perfect alignment of the gate electrodes from one layer to another. It is understood that gaps laterally registered between the first and second electrode layers generally cause corresponding discontinuities in the surface potential within the charge transfer channel of the charge coupled device resulting in inefficiency of charge transfer therethrough. While the overlapping of electrodes between layers eliminates this problem, it causes an increase in capacitance between electrode layers, more commonly referred to as overlap capacitance. As a consequence, a charge coupled device gate clock driver has additional capacitance to drive which, in some cases, may be large compared to the active capacitance of the gate channel. For some special charge coupled device structures, like those having non-destructive readout capabilities, for example, the amount of charge contained in each well is measured with a certain degree of accuracy. Devices of this type may employ a split electrode or a floating clock electrode structure for the sensing electrodes in which it is most desirable to eliminate substantially all parasitic capacitance, including particularly the overlap capacitance. In these devices, the sensitivity of detecting charge goes down with the amount of parasitic capacitance associated with each gate or sensing electrode.

Attempts have been made in the past to align the double layer electrodes to eliminate this overlap capacitance. One such proposed structure is disclosed in a U.S. Patent bearing U.S. Pat. No. 3,967,365, issued on July 6, 1976 by Hans Friedrich and entitled "Process for the Production of a Two-Phase Charge Shift Assembly". The proposed device of Friedrich is described as being constructed by applying an insulating layer to a semiconductor substrate, applying a highly resistive polycrystalline silicon layer to the insulating layer, forming metal electrodes on the polycrystalline layer to thereby protect the zones lying beneath the electrodes, implanting charge carriers by ion implantation in an oblique direction into the zones of the layer of polycrystalline silicon to thereby form conductive electrodes in the layer which serve as electrodes between the electrically insulating zones of polycrystalline material.

While the proposed Friedrich structure does eliminate many processing steps and has the additional advantage of providing contact between the double electrode layers during the processing operation, it should be noted that, without special care in fabrication, metal electrodes should be used for the second layer. If polycrystalline silicon were used for the second electrode layer, during the implanting of charge carriers in the ion implantation step, any dopant implanted in the polysilicon second layer may, under certain conditions, go through the electrode at that layer and into the underlying area possibly diffusing therethrough in all directions. In this case, the insulating gap between the conductive electrodes may not be reliably guaranteed for all the gate electrodes in the channel.

An undesirable feature in using metal for the second layer electrode is that, with conventional processing techniques, it is very difficult to fabricate very narrow width gate electrodes and spacings therebetween. The main reason is that metal electrodes such as aluminum, for example, undercuts during most chemical etching processes. Consequently, special techniques, such as ion milling, for example, have been used at times to remove the aluminum to form the necessary narrow channels between the gate electrodes. Of course, it is understood that with the use of polycrystalline silicon as the second layer very narrow gate widths and spacings therebetween may be easily accomplished with conventional fabrication techniques.

A further disadvantage with using metal for the conductive electrodes of the second layer is that during the annealing process which is usually required in the fabrication of charge coupled device semiconductors particularly to make ohmic contact with the N+ and P+ diffusions, the phenomenon of metal spiking may occur. In this phenomenon, during the annealing process, very thin icicle-like pieces of metal may grow from the second layer metal electrode and may extend through the undoped polysilicon regions to the adjacent doped polysilicon electrodes causing possibly an electrical short between electrodes to occur during operation.

Moreover, even if it is assumed that metal gate electrode structure may be satisfactory used for some charge coupled device applications, it still remains that the ion implantation step in producing the proposed Friedrich structure may not be reliable enough to ensure an insulating gap between all gate electrodes in the charge coupled device channel. For this reason, a low production yield may exist whereby the per unit production associated costs may be excessive.

From the above, it appears that in dealing with charge coupled device structures having electrodes on different conductive levels, a polycrystalline material, such as polycrystalline silicon, for example, may be more suitable than metal for achieving narrow electrode widths and spaces therebetween using conventional processing techniques. When overlapping of electrodes is necessary using polycrystalline silicon or the like, there remains the problem of repeatably establishing small amounts of polysilicon undercut during etching process. To eliminate this electrode overlap necessity, the gate electrodes would have to be aligned with respect to one another to ensure that discontinuities in surface potentials in the charge transfer direction would be substantially eliminated. While the proposed Friedrich structure (U.S. Pat. No. 3,967,365) appears to achieve such a device, a number of disadvantages associated therewith have been uncovered. The present invention as disclosed below provides for a device which overcomes most of the uncovered undesirable features of the proposed Friedrich structure. Applicant's structure is believed to provide for a high production yield device by ensuring a high degree of reproducibility in achieving alignment of the double layer gate electrodes and insulation between the gate electrodes in the device channel. Another advantage of Applicant's structure is that the double layer electrode alignment permits smaller average gate widths since the tolerances for electrode overlap may be substantially eliminated.

SUMMARY OF THE INVENTION

A change coupled device (CCD) having a double layer electrode structure comprises a first dielectric layer disposed over a substantially flat top surface of a semiconductor substitute body at least covering an area which defines a channel through which charge may be propagated. In accordance with the present invention, a first layer of polycrystalline material is disposed over the first dielectric layer covering at least the channel portion thereof. The first polycrystalline layer comprises doped and undoped regions alternating across the channel portion laterally along the path of charge transfer with each region extending at least the length of the channel transverse to the charge transfer path and extending from the first dielectric layer to the top surface of the first polycrystalline layer to form corresponding alternate doped and undoped surface areas. A plurality of first sections of a second dielectric layer are disposed on the top surface of the first polycrystalline layer with each section being correspondingly aligned over an undoped surface area, the doped surface areas remaining substantially exposed. A plurality of second sections of a second layer of doped polycrystalline material are disposed over and correspondingly aligned with the first sections of the second dielectric layer. Thus, the doped regions of the first layer of polycrystalline material and the second sections of the second doped polycrystalline layer constitute the double layer electrodes of the CCD which are substantially aligned to eliminate overlap and which may be electrically insulated from each other with the first section of the second dielectric layer.

A method of fabricating the double layer electrode CCD structure comprises the steps of forming the first dielectric layer over the top surface of the substrate body, depositing the first layer of polycrystalline material on the first dielectric layer, forming a second dielectric layer on the first layer of polycrystalline material, depositing a second layer of polycrystalline material on the second dielectric layer, defining on the exposed surface of the second layer of polycrystalline material across the area of the channel in the direction of charge transfer alternating first and second areas which extend the length of the channel transverse to the charge transfer direction, removing portions of the second layers of dielectric and polycrystalline material which are defined by the first areas to expose surface areas on the first layer of polycrystalline material which are aligned with the first defined areas, and concurrently doping both the portions of the first polycrystalline layer substantially underneath the exposed surfaces thereof and the unremoved portions of the second polycrystalline layer which remain under the second defined areas.

DESCRIPTION OF THE PREFERRED EMBODIMENT

Figure 2:
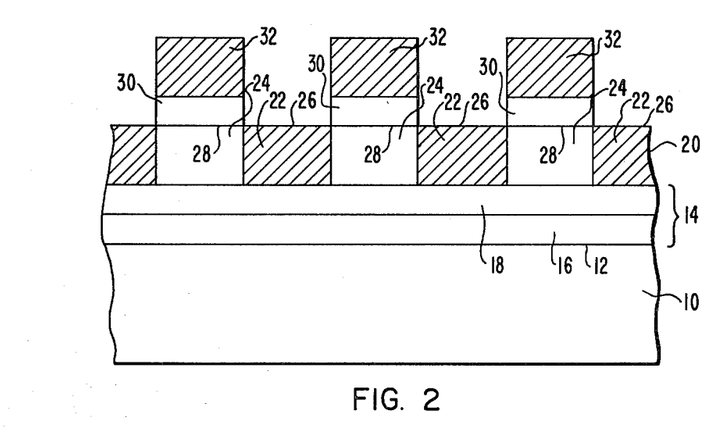
FIG. 2 is a cross-sectional view of a representative portion of an embodiment of a double layer electrode charge coupled device structure depicting applicant's inventive features.

The preferred embodiment of a charge coupled device having a double layer electrode structure comprising a doped polycrystalline material is shown in FIG. 2. In addition, a preferred method of making the charge coupled device of FIG. 2 is described herebelow with the aid of the illustrations depicted in FIGS. 3A through 3E. In FIG. 2 is shown a cross-sectional portion of a charge coupled device sufficient in detail to describe Applicant's inventive principles. The cut of the crosssection of FIG. 2 is lateral to the direction of charge transfer in a conventionally defined channel of the charge coupled device.

Referring to FIG. 2, a substrate body of semiconductor material 10 having a substantially flat top surface 12 has a gate dielectric layer 14 lying on the top surface 12 and at least covering an area which defines the charge transfer channel of the substrate body 10 through which charge may be propagated. Preferably, the gate dielectric layer 14 may be comprised of a double layer, the first layer 16 of which being preferably silicon dioxide and lying over the top surface 12 and the second layer 18 of which being silicon nitride, for example, lying over the layer 16 of silicon dioxide.

Lying over the gate dielectric layer 14 and covering at least the channel portion of the substrate body 10 is a first layer 20 of polycrystalline material, preferably polycrystalline silicon or polysilicon. The polycrystalline layer 20 may be comprised of doped 22 and undoped 24 regions alternating across the channel portion laterally along the path of charge transfer. Each region 22 and 24 may extend at least the length of the channel portion transverse to the charge transfer path. The regions 24 and 22 may also extend in elevation from the gate dielectric 14 to the top surface of the first polycrystalline layer to form corresponding alternating doped and undoped areas 26 and 28, respectively, across the channel area portion of the top surface of the first polycrystalline layer.

A plurality of first sections 30 of a second dielectric layer are disposed on the top surface of the first polycrystalline layer 20 substantially aligned over each of the undoped surface areas 28. The doped surface areas 26 of the first polycrystalline layer remain substantially exposed. A plurality of second sections 32 of a second layer of doped polycrystalline material, preferably polysilicon, are each correspondingly disposed over and substantially aligned with the first sections 30 of the second dielectric layer.

The dielectric layer 30 may be comprised of silicon dioxide in one case, or silicon nitride in another case, or in a third case, a dual layer of silicon dioxide and silicon nitride, in combination. The doped regions 22 of the first layer of polycrystalline material 20 and the second sections 32 of the second doped polycrystalline layer may constitute double layer electrodes of the charge coupled device which are substantially aligned as shown in the cross-sectional configuration of FIG. 2 to eliminate electrode overlap. In addition, electrical insulation between the electrodes of the double layers may be provided by the first sections 30 of the second dielectric layer.

The proposed electrode structure as described in connection with the embodiment of FIG. 2 provides for double layer electrodes of polycrystalline material substantially aligned to eliminate any gaps therebetween along the charge transport direction while avoiding the necessity of overlapping the electrodes. In addition, the electrode structure as proposed in the embodiment of FIG. 2 should also have very good dielectric integrity between the polycrystalline layers since it is not necessary for the oxide to cover completely the electrodes as is normally done in conventional electrode structure (see FIG. 1, for example). Therefore, there is very little or no overlap capacitance between the two electrode levels (22 and 32) of doped polycrystalline material.

In the following paragraphs, a preferred fabrication technique is described for making the double polycrystalline electrode layer charge coupled device structure as described in connection with FIG. 2. The proposed technique eliminates substantially the problem of aligning the electrode layers with respect to one another and the problems caused by non-reproducible polycrystalline material undercut, thereby leaving photolithographic concerns as the primary constraint to obtaining narrow electrode lines and spaces therebetween.

Figure 3A:
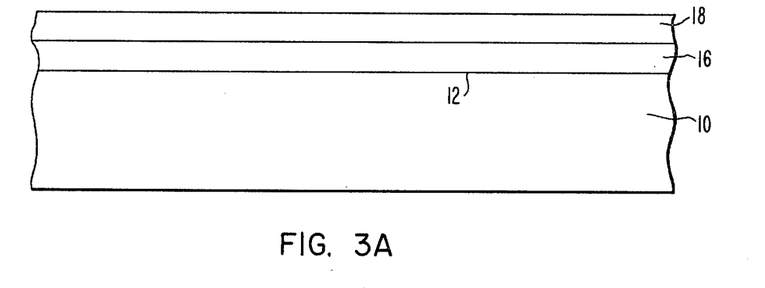
FIGS. 3A through 3E are cross-sectional views illustrating the processing steps of method of fabricating the embodiment of FIG. 2, the views depicting only a representative portion thereof.
Figure 3B:
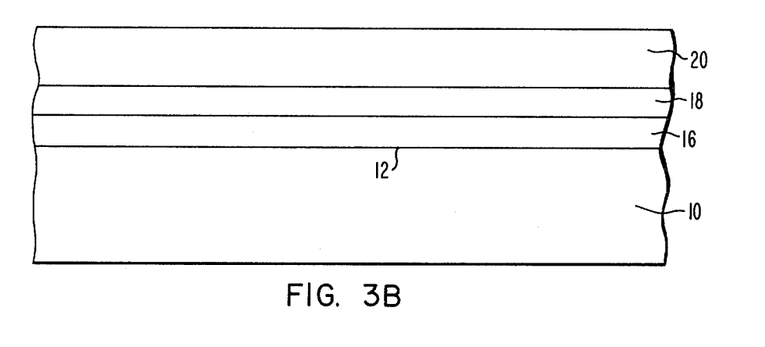

Referring now to FIG. 3A, an oxide layer 16 may be grown on the top surface 12 of the semiconductor substrate 10. Generally, this is accomplished in furnace tubes at temperatures of approximately 900° to 1100° C. in an oxygen and steam atmosphere. The silicon dioxide layer 16 may be grown to a thickness on the order of 800 Angstroms. Next, a silicon nitride layer 18 may be deposited by conventional chemical vapor deposition methods at temperatures of approximately 700° C., for example, on the silicon dioxide layer 16 to a thickness of around 500 Angstroms. Thereafter, as shown in FIG. 3B, an undoped first polycrystalline layer, preferably polysilicon, may be deposited, preferably by conventional vapor deposition techniques, on the silicon nitride layer 18. On the top surface 21 of the undoped first polysilicon layer 20 may be grown, by conventional techniques at elevated temperatures, a second layer of oxide denoted at 30 in FIG. 3C.

Figure 3C:
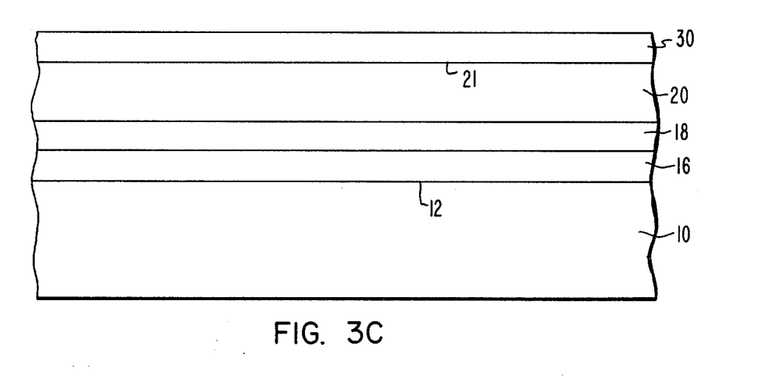

The deposited layer of undoped polysilicon 20 may range in thickness from 1000 to 3000 Angstroms and the growth of oxide layer 30 on the top surface 21 thereof may be on the order of 1000 Angstroms. It is understood that in some cases, a silicon nitride layer may be deposited on the top surface 21 in place of the oxide 30 to function as a second dielectric layer without deviating from the Applicant's inventive principles. Likewise, for the same purpose, both an oxide layer may be grown and a silicon nitride deposited thereover to constitute, in combination, the second dielectric layer 30 again without deviating from Applicant's inventive principle.

Figure 3D:
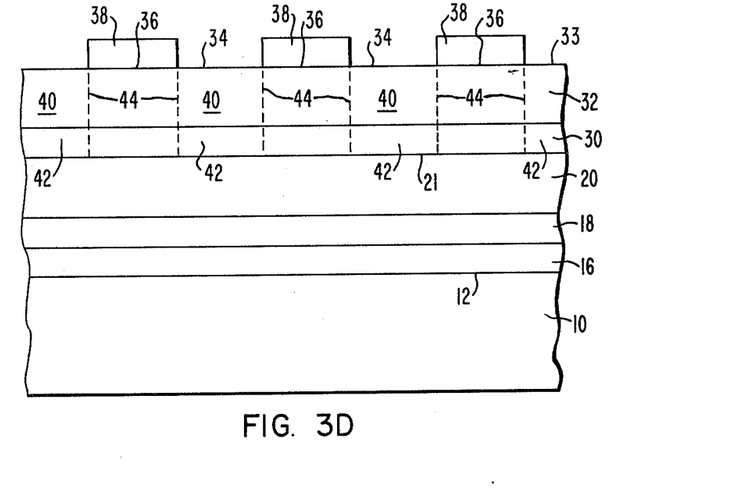

Next, a second undoped polycrystalline material layer may be conventionally deposited on top of the second dielectric layer 30 to some predetermined thickness which may be on the order of 1000 to 3000 Angstroms, for example. Referring to FIG. 3D, on the exposed surface 33 of the second layer of polycrystalline material 32, alternating first and second surfaces areas, 34 and 36, respectively, are defined laterally across the channel of the charge coupled device in the direction of charge transfer. Each surface area 34 and 36 may extend the length of the channel transverse to the charge transfer direction. In the preferred method, the surface area definition may be accomplished by conventionally spinning a resist material on the surface 33 and then, photolithographically defining resist regions 38 directly over the surface areas 36. Thus, the gaps between the resist regions 38 define the surface areas 34 on the top surface 33 of the second layer of material 32.

Regions 40 in the second polycrystalline layer 32 lying directly underneath the exposed first defined areas 34 (outlined by the dashed lines 44 in FIG. 3D) may next be conventionally dry etched or plasma etched down to the intervening dielectric layer 30. Thereafter, the regions 42 of the dielectric layer 30 lying directly under the first defined surface areas 34 (also outlined by the dashed lines 44 in FIG. 3D), may be chemically etched down to the top surface 21 of the first polycrystalline layer 20. In the case, where silicon dioxide is the dielectric material of the layer 30, a buffered hydrofluoric acid mixture, or ammonium fluoride mixture, or diluted hydrofluoric acid mixture may be used in the etching process thereof. After the regions 40 and 42 have been completely removed to the top layer 21 as defined by the first surface areas 34, the photoresist layers 38 may be conventionally stripped. The resulting structure, as shown in FIG. 3E, provides for exposed surface areas on the top surface 21 of the first polycrystalline layer 20 which are defined by the first areas 34 and in addition, exposed surface areas on the second polycrystalline layer 32 which are defined by the second areas 36.

Figure 3E:
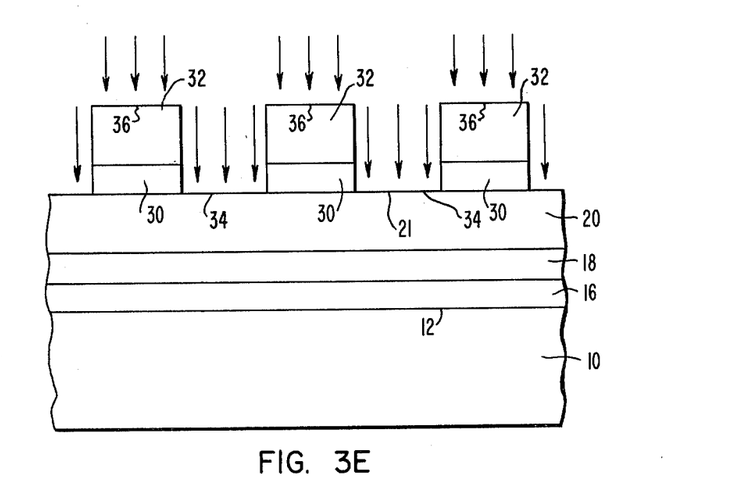

Referring to FIG. 3E, both exposed surface areas 34 and 36 of the first and second polycrystalline layers, respectively, may be next concurrently doped (illustrated by the pointed arrows) to a relatively high conductivity, which may be on the order of 50 ohms per square, for example, by a high concentration of ion implantation using a suitable dopant material of either boron, phosphorus, or arsenic, for example. It is understood by those skilled in the pertinent art that a diffusion at the temperatures of 900°–1000° C., for example, may also be used to dope the polycrystalline material lying under the surface areas 34 and 36 (FIG. 3E) using similar dopant materials to achieve the same resulting structure. With further temperature cycling in accordance with known processing techniques, the oxide layer 30 under the second polysilicon layer 32 prevents the diffusion of dopant atoms from passing through the second polycrystalline layer regions 32 and entering into the undoped region of the first polycrystalline layer lying substantially thereunder. The resulting doped charge coupled device structure is shown in FIG. 2 and has been described in detail supra.

It is evident to all those skilled in the pertinent art that the proposed structure and method for making the same is much simpler in terms of the number of process steps and in the photo engraving requirements. The undoped polycrystalline layers 24 which lie directly under and aligned with the dielectric regions 30 and doped second layer of polycrystalline material regions 32 may act essentially as part of the gate dielectric 14 for the second layer electrode 32. As an added feature, since the resistivity of the undoped polysilicon, for example, is approximately $10^6$ ohm-centimeter, a linear voltage drop may be obtained laterally across the undoped polysilicon region of the first layer when a bias is applied to the second conductive electrode layers with respect to the substrate body 10.

Figure 4:
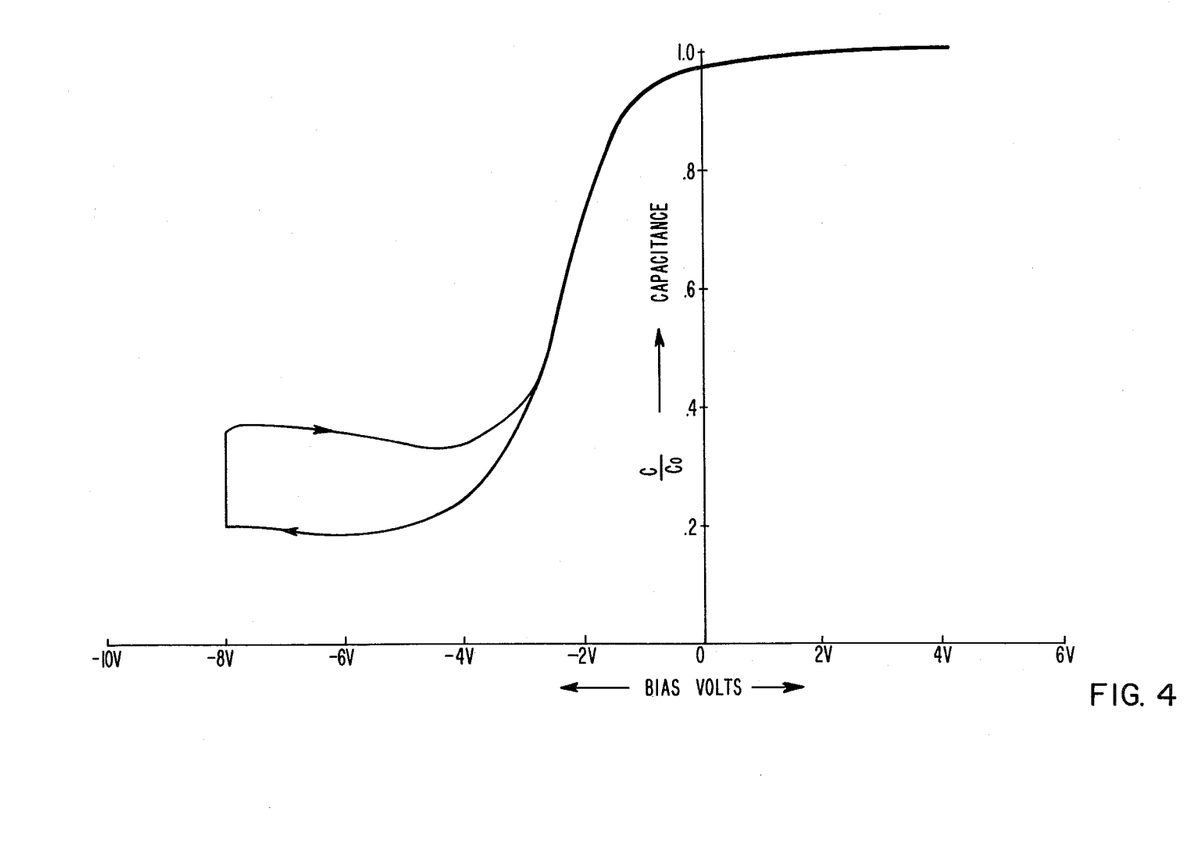
FIG. 4 is a C-V graph illustrating the operational characteristics of a conductive electrode separated from a silicon substrate layer by a double layer of undoped polysilicon and silicon dioxide.

To illustrate these characteristics, FIG. 4 a C-V curve of a metal gate on 1000 Angstroms of undoped polysilicon and 800 Angstroms of silicon dioxide. The relative dielectric constant of undoped polysilicon is 12 while that of the oxide is 4, thus an undoped polysilicon layer may be electrically equivalent to an oxide layer a third of its thickness. Accordingly, a step in the equivalent oxide thickness will translate to a difference in potential minimum in the charge coupled device channel. For a surface channel charge coupled device, for example, the potential minimum may lie under the region with the thinner dielectric; while for a buried channel charge coupled device, the potential minimum may lie under the region with the thicker dielectric as will be described in more greater detail herebelow.

Figure 5A:
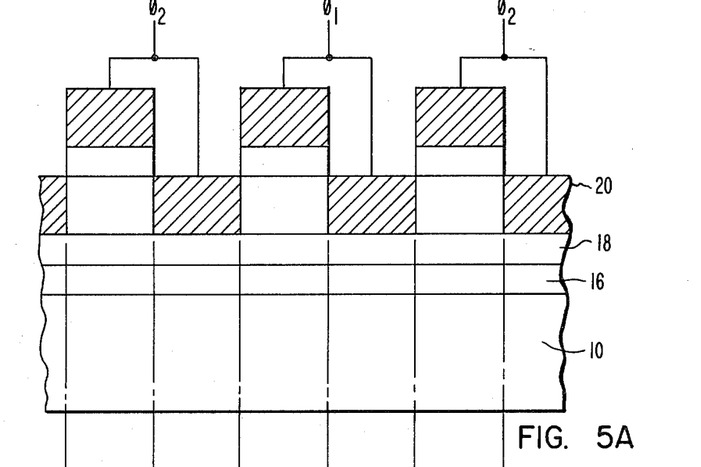
FIGS. 5A, 5B and 5C are illustrations depicting the operation of the embodiment of FIG. 2 configured as a two-phase surface channel CCD.
Figure 5B:
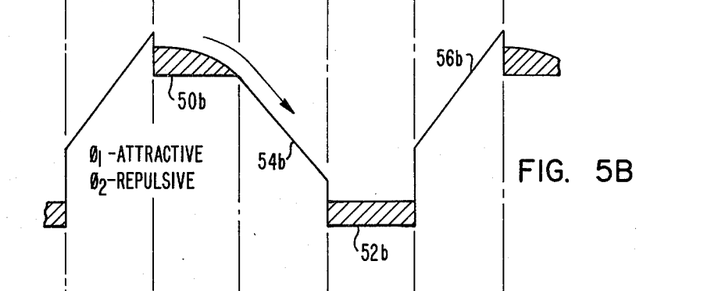
Figure 5C:
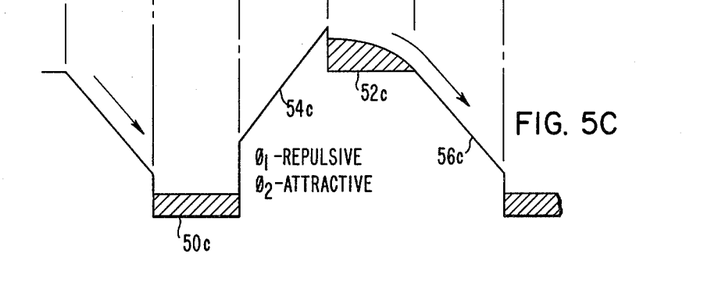

Referring to FIGS. 5A, 5B and 5C, when the charge coupled device structure as described in connection with FIG. 2 is connected to operate as a two-phase surface channel charge coupled device as shown in FIG. 5A, its resulting operation may be depicted by the potential minimum diagrams of FIGS. 5B and 5C. For example, when a repulsive bias potential is applied to the electrodes governed by the clock signal $\phi_2$ and an attractive bias potential is applied to the electrode governed by the clock signal $\phi_1$, the potential minimums effected at the surface under their corresponding doped polycrystalline electrodes may be as exemplified in FIG. 5B at 50b and 52b, respectively. In addition to the vertical voltage drop across the undoped regions of the first polycrystalline layer to the silicon substrate, there may be additionally effected a lateral, substantially linear, voltage drop between any two adjacent first layer conductive electrodes when there is a bias potential established therebetween. In FIG. 5B, the electrodes governed by the clock signal $\phi_1$ may be considered the holding gates and accordingly, the electrodes governed by the clock signal $\phi_2$ may be considered the transfer gates for the two-phase surface channel charge coupled device of FIG. 5A. The lateral voltage drop in the undoped region of the first polycrystalline layer may cause a lateral electric field in the surface channel of the charge coupled device in the direction to aid the transport of charge carriers as exemplified by the inclined line 54b in FIG. 5B, wherein the lateral aiding field is under the holding gate governed by the clock signal $\phi_1$. When the potentials of the clock signals are reversed, that is, $\phi_1$ being repulsive and $\phi_2$ being attractive as shown in FIG. 5C, the electrodes governed by the clock signal $\phi_2$ become the holding gates and the electrodes governed by the clock signal $\phi_1$ become the transfer gates. Thus, the field aiding lateral linear voltage drop is shifted to the surface channel portion under the undoped region of the first polycrystalline layer governed by the clock signal $\phi_2$ as shown at 56c in FIG. 5C.

Figure 6A:
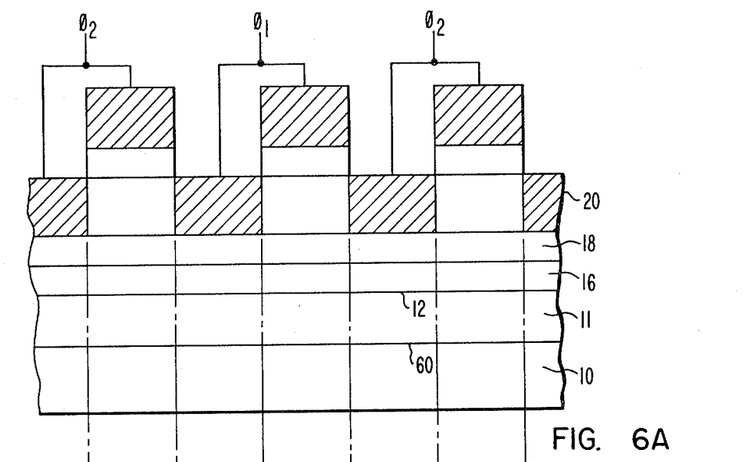
FIGS. 6A, 6B and 6C are illustrations depicting the operation of the embodiment of FIG. 2 configured as a two-phase buried channel CCD.
Figure 6B:
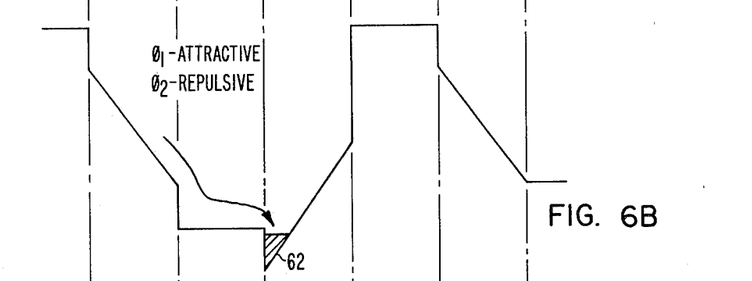
Figure 6C:
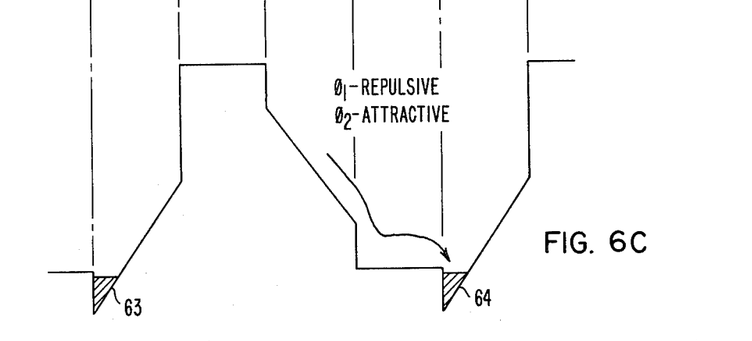
Figure 7A:
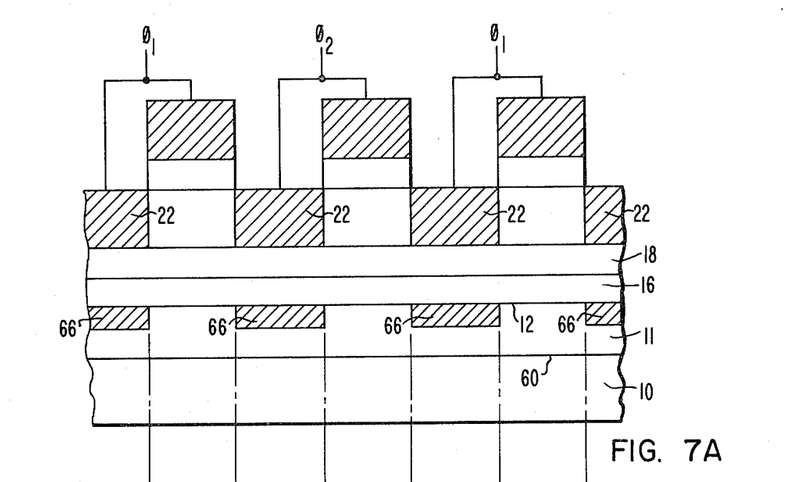
FIGS. 7A, 7B and 7C are illustrations depicting the operation of the embodiment of FIG. 2 configured alternatively as another two-phase buried channel CCD.
Figure 7B:
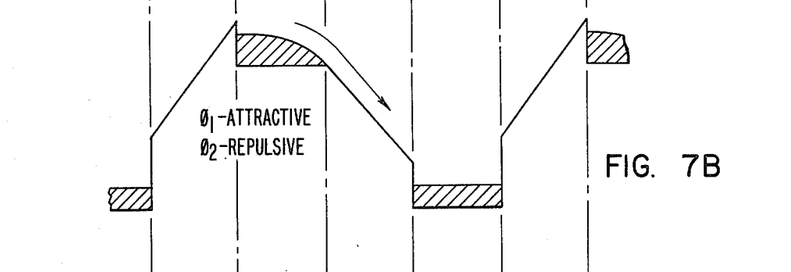
Figure 7C:
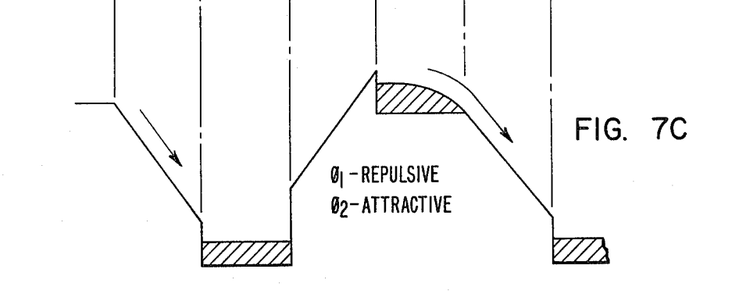

In some instances, it may be desirable to operate the double layer electrode charge coupled device structure as a two-phase buried channel device. To operate as a buried channel device, the surface 12 of the semiconductor substrate 10 may be conventionally doped to form a surface region 11 across the channel of the charge coupled device as shown by the cross-sectional representation of FIG. 6A. Charge transfer may therefore occur through a buried channel generally at the interface between the regions 10 and 11 denoted by line 60 in the cross-sectional representation of 6A. The potential minimum graphs of FIGS. 6B and 6C exemplify the charge transfer operation of the buried channel device represented in FIG. 6A. Note that the two-phase buried channel charge coupled device appears to have a reduced charge storage capacity as shown at point 62 in FIG. 6B and 63 and 64 in FIG. 6C. This condition may be rectified for the two-phase, buried channel charge coupled device structure of 6A by implanting dopant atoms through the doped region of the first polycrystalline layer using the adjacent thicker polycrystalline layers and photoresist as implant masks. The dopant type may be chosen to make the potential minimum under the first level conductive electrode more attractive to electrons than under the second level conductive electrode. The resulting structure may be similar to that as shown in FIG. 7A. The shaded regions 66 in the region 11 of the semiconductor substrate body 10 are representative of the implanted dopant atoms which have passed through the first layer conductive electrodes shown as 22 in FIG. 7A. The potential minimum graphs of FIGS. 7B and 7C exemplify the resulting operation of the two-phase buried channel charge coupled device having the doped regions 66 implanted therein as shown in the structure of FIG. 7A.

Figure 8A:
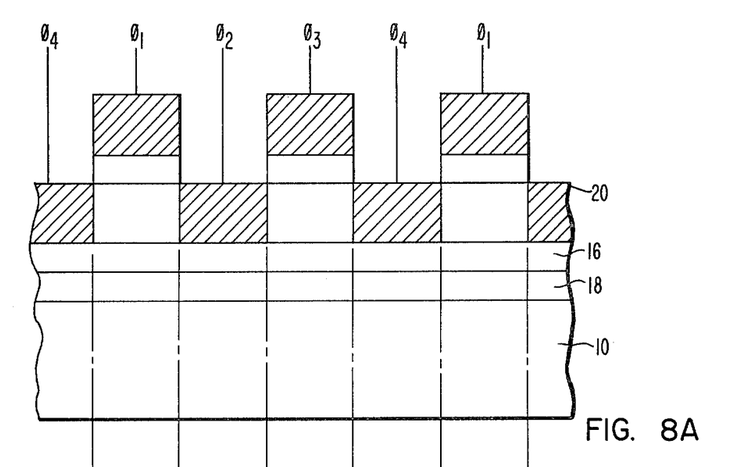
FIGS. 8A, 8B and 8C are illustrations depicting the operation of the embodiment of FIG. 2 configured as a four-phase surface channel CCD having the same bias potentials for all phase clocking signals $\phi_1$ through $\phi_4$.
Figure 8B:
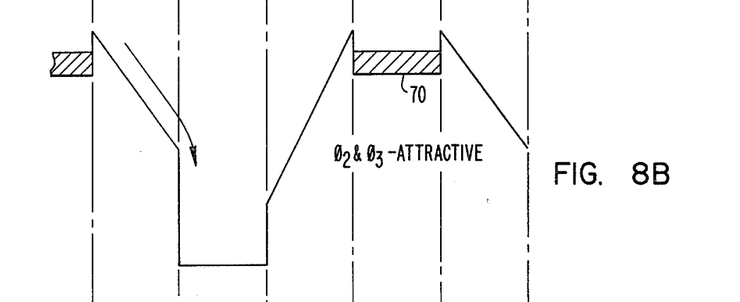
Figure 8C:
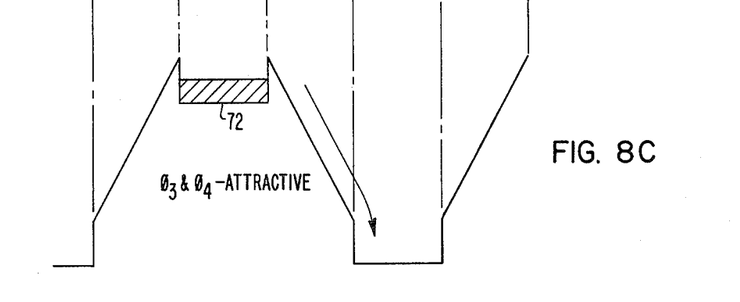

It is further understood by those skilled in the pertinent art that the charge coupled device structure as described in connection with FIG. 2 may also be configured to operate in a four-phase mode. FIG. 8A exemplifies a cross-sectional view representation of this four-phase operational mode configuration. FIGS. 8B and 8C are representative of the potential minimum diagrams exemplifying the operation of the four-phase surface channel charge coupled device of FIG. 8A when the bias potential levels of the clock signals $\phi_1$ through $\phi_4$ are the same for all phases. For this example, it is well to note that there is the possibility of charge traps developing under some electrodes during the four-phase operation. This is illustrated at point 70 in FIG. 8B and again at point 72 in FIG. 8C.

Figure 9A:
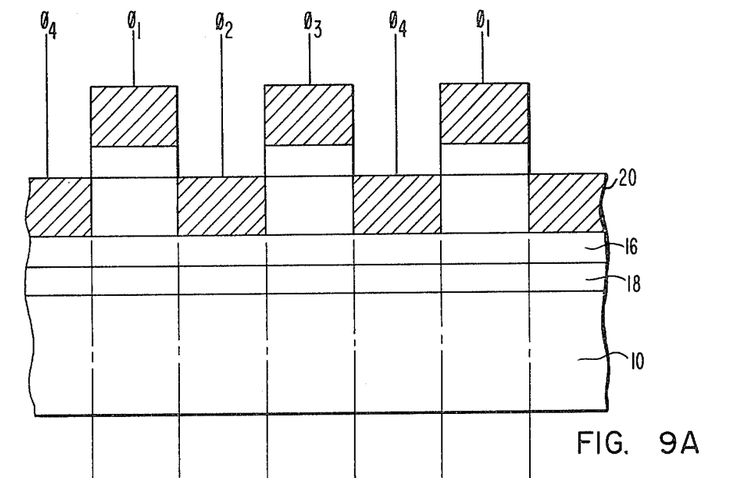
FIGS. 9A, 9B and 9C are illustrations depicting the operation of the embodiment of FIG. 2 configured as a four-phase surface channel CCD having independent control of the repulsive bias potentials of the phase clocking signals $\phi_1$–$\phi_4$.
Figure 9B:
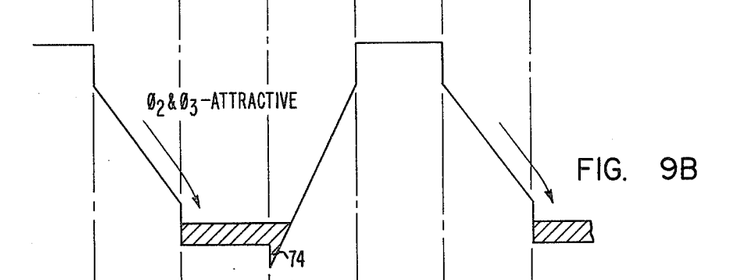
Figure 9C:
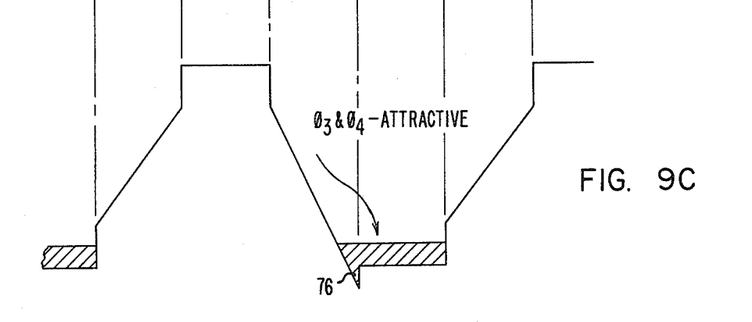

To resolve this undesirable situation, the four clock signals $\phi_1$ through $\phi_4$ governing the conductive polycrystalline double layer electrodes may be operated in such a manner to effect independent control over the repulsive bias potential levels thereof. In so doing, the potential minimum operation diagrams may be more in line with that represented in FIGS. 9B and 9C which illustrate that the charge traps may be eliminated substantially. However, potential dips, such as that shown at 74 in FIG. 9B and at 76 in FIG. 9C, for example, may be created in the operational process. To substantially eliminate these potential clips 74 and 76, it has been proposed to have independent control over the attractive bias level in addition to the independent control of the repulsive bias levels of the clock signals $\phi_1$ through $\phi_4$.

In the above operational examples, that the charge coupled device two layer electrode structure described in connection with the embodiment of FIG. 2 may be suitably configured to operate as a two-phase or four-phase surface channel device, and in addition, a two-phase buried channel device. Needless to say, these examples are merely representative of only a few of the possible configurations to which the structure of FIG. 2 may be applied.

In closing it is worth noting that the structural embodiment of FIG. 2 appears most promising in commercial areas of high volume production primarily because of the reduced number of processing steps and the non-critical alignment associated with eliminating electrode overlap. Accordingly, the ease of fabricating narrow line width and spaces along with the lateral aided electric field make this double polycrystalline layer electrode charge coupled device structure a promising new technology for high frequency charge coupled devices.

I claim:

1. A charge coupled device having a double layer electrode structure comprising:
    a substrate body of semiconductor material having a substantially flat top surface;
    a first dielectric layer lying on said top surface of said substrate body and at least covering an area which defines a charge transfer channel of said substrate body through which charge may be propagated;
    a first layer of polycrystalline material lying over said first dielectric layer and covering at least said channel portion thereof, said first polycrystalline layer comprising doped and undoped regions alternating across said channel portion laterally along the path of charge transfer, each region extending at least the length of said channel portion transverse to the charge transfer path and extending from said first dielectric layer to the top surface of said first polycrystalline layer to form corresponding alternating doped and undoped surface areas across said channel portions of said top surface thereof;
    a plurality of first sections of a second dielectric layer, each first section lying on said top surface of said first polycrystalline layer substantially aligned over each of said undoped surface areas, said doped surface areas of said first polycrystalline layer remaining substantially exposed;
    a plurality of second sections of a second layer of doped polycrystalline material, each second section lying over and substantially aligned with each of said first sections of said second dielectric layer, whereby the doped regions of said first layer of polycrystalline material and said second sections of the second doped polycrystalline layer constitute double layer electrodes of the charge coupled device which are substantially aligned to eliminate overlap and may be electrically insulated from each other with the first section of the second dielectric layer.

2. The charge coupled device in accordance with claim 1 wherein the polycrystalline material of the first and second polycrystalline layers comprises polysilicon.

3. The charge coupled device in accordance with claim 2 wherein the doped polysilicon is doped with an impurity selected from the group consisting of boron, phosphorus and arsenic.

4. The charge coupled device in accordance with claim 1 wherein the first and second polycrystalline layers each have a thickness in the approximate range of 1000–3000 Angstroms.

5. The charge coupled device in accordance with claim 1 wherein the second dielectric layer is comprised of $SiO_2$.

6. The charge coupled device in accordance with claim 1 wherein the second dielectric layer is comprised of $Si_3N_4$.

7. The charge coupled device in accordance with claim 1 wherein the second dielectric layer is a dual layer, one layer being comprised of $SiO_2$ and the other being comprised of $Si_3N_4$.

8. The charge coupled device in accordance with claim 1 wherein the second dielectric layer has a thickness of approximately 1000 Angstroms.

9. The charge coupled device in accordance with claim 1 wherein the charge transfer channel is located at the top surface of the semiconductor substrate body.

10. The charge coupled device in accordance with claim 1 wherein the charge transfer channel is buried below the top surface of the semiconductor substrate body.

11. The charge coupled device in accordance with claim 10 including a plurality of doped semiconductor regions disposed at the top surface of the substrate body, each of said doped semiconductor regions being aligned substantially under the doped regions of the first polycrystalline layer.

* * * * *